(12) United States Patent
Lung et al.

(10) Patent No.: US 7,450,411 B2
(45) Date of Patent: Nov. 11, 2008

(54) PHASE CHANGE MEMORY DEVICE AND MANUFACTURING METHOD

(75) Inventors: Hsiang Lan Lung, Elmsford, NY (US); Shih-Hung Chen, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 230 days.

(21) Appl. No.: 11/459,106

(22) Filed: Jul. 21, 2006

(65) Prior Publication Data

US 2007/0121374 A1 May 31, 2007

Related U.S. Application Data

(60) Provisional application No. 60/736,722, filed on Nov. 15, 2005.

(51) Int. Cl.
*G11C 11/00* (2006.01)

(52) U.S. Cl. .............. 365/148; 365/163; 257/379; 257/537; 257/4; 257/529

(58) Field of Classification Search ............. 365/148, 365/163; 257/379, 537, 4, 529
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 4,959,812 A | 9/1990 | Momodomi et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |

(Continued)

FOREIGN PATENT DOCUMENTS

WO  WO 00/45108 A1  8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Viet Q Nguyen
(74) *Attorney, Agent, or Firm*—James F. Hann; Haynes Beffel & Wolfeld LLP

(57) ABSTRACT

A phase change memory device comprises a photolithographically formed phase change memory cell having first and second electrodes and a phase change bridge positioned between and electrically coupling the opposed sides of the electrodes to one another. The phase change bridge has a length, a width and a thickness. The width, the thickness and the length are less than a minimum photolithographic feature size of the process used to form the phase change memory cell. The size of the photoresist masks used in forming the memory cell may be reduced so that the width and the length of the phase change bridge are each less than the minimum photolithographic feature size.

16 Claims, 16 Drawing Sheets

U.S. PATENT DOCUMENTS

| | | | |
|---|---|---|---|
| 5,534,712 A | 7/1996 | Ovshinsky et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,456,525 B1 * | 9/2002 | Perner et al. ................ 365/171 |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,620,715 B1 | 9/2003 | Blosse et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi |
| 6,808,991 B1 | 10/2004 | Tung et al. |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,937,637 B1 * | 8/2005 | Thornton et al. .............. 372/93 |
| 6,972,430 B2 | 12/2005 | Casagrande et al. |
| 6,992,932 B2 | 1/2006 | Cohen |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,864 B2 | 6/2006 | Nishida et al. |
| 7,067,865 B2 | 6/2006 | Lung et al. |
| 7,122,281 B2 | 10/2006 | Pierrat |
| 7,126,149 B2 | 10/2006 | Iwasaki et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 7,238,994 B2 * | 7/2007 | Chen et al. ................ 257/379 |
| 7,251,152 B2 * | 7/2007 | Roehr ...................... 365/100 |
| 7,277,317 B2 | 10/2007 | Le Phan et al. |
| 7,321,130 B2 * | 1/2008 | Lung et al. ................... 257/4 |
| 2001/0055838 A1 | 12/2001 | Walker et al. |
| 2002/0081833 A1 | 6/2002 | Li et al. |
| 2004/0051094 A1 | 3/2004 | Ooishi |
| 2004/0248339 A1 | 12/2004 | Lung |
| 2005/0029502 A1 | 2/2005 | Hudgens |
| 2005/0093022 A1 | 5/2005 | Lung |
| 2005/0201182 A1 | 9/2005 | Osada et al. |
| 2005/0212024 A1 | 9/2005 | Happ |
| 2005/0215009 A1 | 9/2005 | Cho |
| 2006/0043617 A1 | 3/2006 | Abbott |
| 2006/0108667 A1 | 5/2006 | Lung |
| 2006/0110878 A1 | 5/2006 | Lung et al. |
| 2006/0118913 A1 | 6/2006 | Yi et al. |
| 2006/0154185 A1 | 7/2006 | Ho et al. |
| 2006/0175599 A1 | 8/2006 | Happ |
| 2006/0234138 A1 | 10/2006 | Fehlhaber et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0108077 A1 | 5/2007 | Lung et al. |

| | | | |
|---|---|---|---|
| 2007/0108429 | A1 | 5/2007 | Lung |
| 2007/0108430 | A1 | 5/2007 | Lung |
| 2007/0108431 | A1 | 5/2007 | Chen et al. |
| 2007/0109836 | A1 | 5/2007 | Lung |
| 2007/0109843 | A1 | 5/2007 | Lung et al. |
| 2007/0111429 | A1 | 5/2007 | Lung |
| 2007/0115794 | A1 | 5/2007 | Lung |
| 2007/0117315 | A1 | 5/2007 | Lai et al. |
| 2007/0121363 | A1 | 5/2007 | Lung |
| 2007/0121374 | A1 | 5/2007 | Lung et al. |
| 2007/0126040 | A1 | 6/2007 | Lung |
| 2007/0131922 | A1 | 6/2007 | Lung |
| 2007/0131980 | A1 | 6/2007 | Lung |
| 2007/0138458 | A1 | 6/2007 | Lung |
| 2007/0147105 | A1 | 6/2007 | Lung et al. |
| 2007/0154847 | A1 | 7/2007 | Chen et al. |
| 2007/0155172 | A1* | 7/2007 | Lai et al. ............ 438/666 |
| 2007/0158632 | A1 | 7/2007 | Ho |
| 2007/0158633 | A1 | 7/2007 | Lai et al. |
| 2007/0158645 | A1 | 7/2007 | Lung |
| 2007/0158690 | A1 | 7/2007 | Ho et al. |
| 2007/0158862 | A1 | 7/2007 | Lung |
| 2007/0161186 | A1 | 7/2007 | Ho |
| 2007/0173019 | A1 | 7/2007 | Ho et al. |
| 2007/0173063 | A1 | 7/2007 | Lung |
| 2007/0176261 | A1 | 8/2007 | Lung |
| 2007/0224726 | A1 | 9/2007 | Chen et al. |
| 2007/0246699 | A1 | 10/2007 | Lung |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.
Ahn, S.J. et al., "A Highly Manufacturable High Density Phase Change Memory of 64 Mb and Beyond," IEEE IEDM 2004, pp. 907-910.
Axon Technologies Corporation paper: Technology Description, pp. 1-6.
Bedeschi, F. et al., "4-MB MOSFET-Selected Phase-Change Memory Experimental Chip," IEEE, 2004, 4 pp.
Blake thesis, "Investigation of GeTeSb5 Chalcogenide Films for Use as an Analog Memory," AFIT/GE/ENG/00M-04, Mar. 2000, 121 pages.
Chen, An et al., "Non-Volatile Resistive Switching for Advanced Memory Applications," IEEE IEDM , Dec. 5-7, 2005, 4 pp.
Cho, S. L. et al., "Highly Scalable On-axis Confined Cell Structure for High Density PRAM beyond 256Mb," 2005 Symposium on VLSI Technology Digest of Technical Papers, pp. 96-97.
Gill, Manzur et al., "High-Performance Nonvolatile Memory Technology for Stand-Alone Memory and Embedded Applications," 2002 IEEE-ISSCC Technical Digest (TD 12.4), 7 pp.
Ha, Y. H. et al. "An Edge Contact Type Cell fro Phase Change RAM Featuring Very Low Power Consumption," 2003 Symposium on VLSI Technology Digest of Technical Papers, pp. 175-176.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.
Horii, H. et al., "A Novel Cell Technology Using N-doped GeSbTe Films for Phase Change RAM," 2003 Symposium on VLSI Technology Digest of Technical Papers, pp. 177-178.
Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L.; "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., OUM-A 180 nm Nonvolatile Memory Cell Element Technology for Stand Alone and Embedded Applications, IEEE IEDM 2001, pp. 803-806.
Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.
Mott, Nevill, "Electrons in Glass," Nobel Lecture, Dec. 8, 1977, Physics, 1977, pp. 403-413.
Ovonyx Non-Confidential paper entitled "Ovonic Unified Memory," Dec. 1999, pp. 1-80.
Ovshinksy, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al., "Novel μ Trench Phase-Change Memory Cell for Embedded and Stand-Alone Non-Volatile Memory Applications," 2004 Symposium on VLSI Technology Digest of Technical Papers, pp. 18-19.
Prakash, S. et al., "A Guideline for Designing Chalcogenide-Based Glasses for Threshold Switching Characteristics," IEEE Electron Device Letters, vol. 18, No. 2, Feb. 1997, pp. 45-47.
Rochefort, C. et al., "Manufacturing of High Aspect-Ration p-n Junctions Using Vapor Phase Doping for Application in Multi-Resurf Devices," IEEE 2002.
Strauss, Karl F. et al., "Overview of Radiation Tolerant Unlimited Write Cycle Non-Volatile Memory," IEEE 2000.
Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.
Wicker, Guy et al., Nonvolatile, High Density, High Performance Phase Change Memory, 1999 http://klabs.org/richcontent/MAPLDCon99/Papers/P21_Tyson_P.PDF#search='nonvolatile%20high%20density%20high%20performance%20phase%20change%20memory', 8 pages.
Wicker, Guy, "A Comprehensive Model of Submicron Chalcogenide Switching Devices," Doctoral Dissertation, Wayne State University, Detroit, MI, 1996.
Wolf, Stanley, Excerpt from: Silicon Processing for the VLSI Era-vol. 4, pp. 674-679, 2004.
Yi, J. H. et al., "Novel Cell Structure of PRAM with Thin Metal Layer Inserted GeSbTe," IEEE IEDM 2003, 4 pages.
Yonehara, T. et al., "Control of Grain Boundary Location by Selective Nucleation Over Amorphous Substrates," Mat. Res. Soc. Symp. Proc., vol. 106, 1998, pp. 21-26.
Gibson, G.A. et al., "Phase-change Recording Medium that Enables Ultrahigh-density Electron-beam Data Storage," Applied Physics Letter, 2005, 3 pp., vol. 86.
Happ, T.D. et al., "Novel None-Mask Self-Heating Pillar Phase Change Memory," 2006 Symposium on VLSI Technology, 2 pp.
Hudgens, S. et al., "Overview of Phase-Change Chalcogenide Nonvolatile Memory Technology," MRS Bulletin, Nov. 2004, pp. 829-832.
"Magnetic Bit Boost," www.sciencenews.org <http://www.sciencenews.org>, Dec. 18 & 25, 2004, p. 389, vol. 166.
"New Memories Tap Spin, Gird for Battle," Science News, Apr. 3, 1999, p. 223, vol. 155.

Pirovano, Agostino et al., "Reliability Study of Phase-Change Nonvolatile Memories," IEEE Transactions on Device and Materials Reliability, Sep. 2004, pp. 422-427, vol. 4, No. 3.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Wuttig, Matthias, "Towards a Universal Memory?" Nature Materials, Apr. 2005, pp. 265-266, vol. 4.

Ahn, S. J. et al., "Highly Reliable 5nm Contact Cell Technology for 256Mb PRAM," VLSI Technology, Digest of Technical Papers, Jun. 14-16, 2005, pp. 98-99.

* cited by examiner

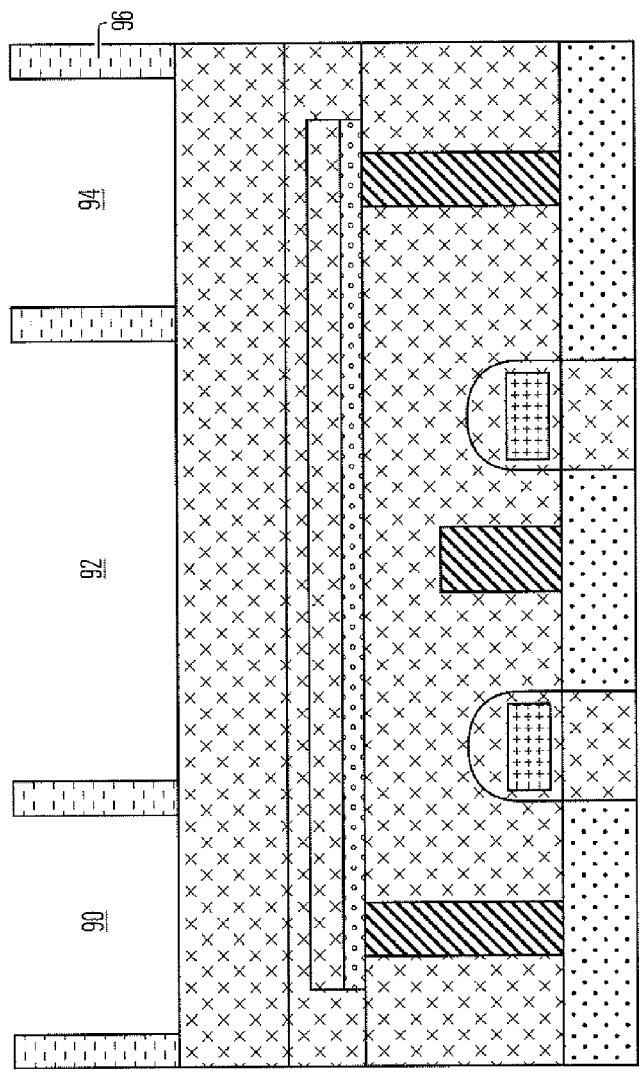
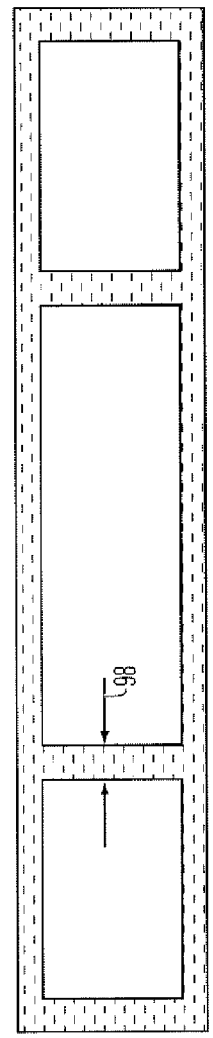
FIG. 16
FIG. 17

PHASE CHANGE MEMORY DEVICE AND MANUFACTURING METHOD

CROSS REFERENCE TO RELATED APPLICATIONS

This application claims the benefit of provisional patent application No. 60/736,722 filed 15 Nov. 2005.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or break down the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. It is desirable therefore to provide a memory cell structure having small dimensions and low reset currents, and a method for manufacturing such structure.

SUMMARY OF THE INVENTION

A first aspect of the invention is directed to a phase change memory device comprising a memory cell access layer and a memory cell layer, operably coupled to the memory cell access layer, comprising a photolithographically formed phase change memory cell. The memory cell comprises first and second electrodes, having first and second opposed, spaced apart sides, and a phase change bridge positioned between the first and second sides and electrically coupling the first and second sides to one another. The phase change bridge has a length, a width and a thickness, the width measured between the first and second sides and the length measured perpendicular to the width. The width, the thickness and the length are less than a minimum photolithographic feature size of the process used to form the phase change memory cell. In some embodiments the minimum photolithographic feature size is about 200 mm, the width is about 10 to 100 nm, the length is about 10 to 50 nm, and the thickness is about 10 to 50 nm.

A second aspect of the invention is directed to a method for making a phase change memory device. A memory cell access layer is formed on a substrate, the memory cell access layer comprising an access device and a top surface. A memory cell layer is formed and is operably coupled to the memory cell access layer, the memory cell layer comprising a photolithographically formed phase change memory cell. The memory cell comprises first and second electrodes, having first and second opposed, spaced apart sides, and a phase change bridge positioned between the first and second sides and electrically coupling the first and second sides to one another. The phase change bridge has a length, a width and a thickness. The memory layer forming step comprises reducing the size of photoresist masks used in the memory layer forming step so that the width and the length of the phase change bridge are each less than a minimum photolithographic feature size of the process used to form the phase change memory cell.

The method described herein for formation of the phase change bridge, for use in a memory cell in a phase change read only memory (PCRAM) device, can be used to make small phase change gates, bridges or similar structures for other devices.

Various features and advantages of the invention will appear from the following description in which the preferred embodiments have been set forth in detail in conjunction with the accompanying drawings.

BRIEF DESCRIPTION OF THE DRAWINGS

FIGS. 3-20 illustrate a method for making phase change memory devices, such as the device of FIGS. 1 and 2;

FIGS. 3 and 4 illustrate the final stages for making the memory cell access layer of FIG. 2;

FIGS. 5 and 6 illustrates alternative embodiments of the memory cell access layer of FIG. 4;

FIG. 7 illustrates the deposition of a phase change material layer and a first barrier layer on top of the memory cell access layer of FIG. 4;

FIGS. 8 and 9 are side and top views showing a first photoresist mask on the first barrier layer;

FIGS. 10 and 11 illustrate the result of trimming the mask of FIGS. 8 and 9;

FIG. 12 shows the result of etching the mask of FIG. 10;

FIG. 13 shows the structure of FIG. 12 with the trimmed mask removed;

FIGS. 14 and 15 illustrates a result of several processing steps to create the three open regions defined by a second photoresist mask;

FIGS. 16 and 17 illustrate the result of trimming the second photoresist mask;

FIG. 18 shows a result of etching down to the top surface of the memory cell access layer using the trimmed second photoresist mask as a guide;

FIG. 19 shows the structure of FIG. 18 after the second photoresist mask has been removed; and FIG. 20 shows creation of the first, second and third electrodes within the first, second and third open regions of the structure of FIG. 19.

DETAILED DESCRIPTION

Figure 1:
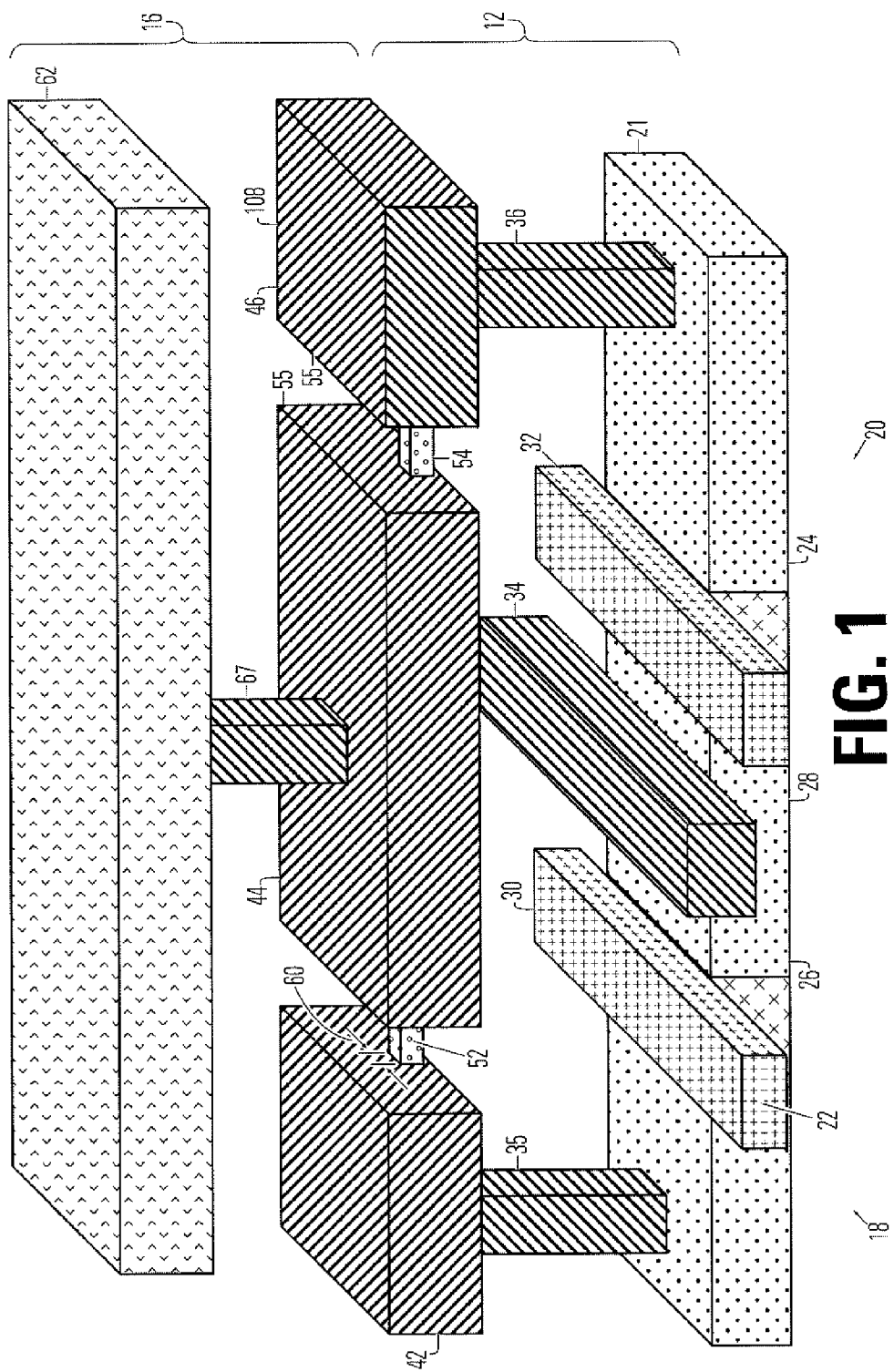
FIGS. 1 and 2 are a simplified isometric view and a simplified cross-sectional view of the components of a phase change memory device made according to the invention.

The following description of the invention will typically be with reference to specific structural embodiments and methods. It is to be understood that there is no intention to limit the invention to the specifically disclosed embodiments but that the invention may be practiced using other features, elements, methods and embodiments. Like elements in various embodiments are commonly referred to with like reference numerals.

Figure 2:
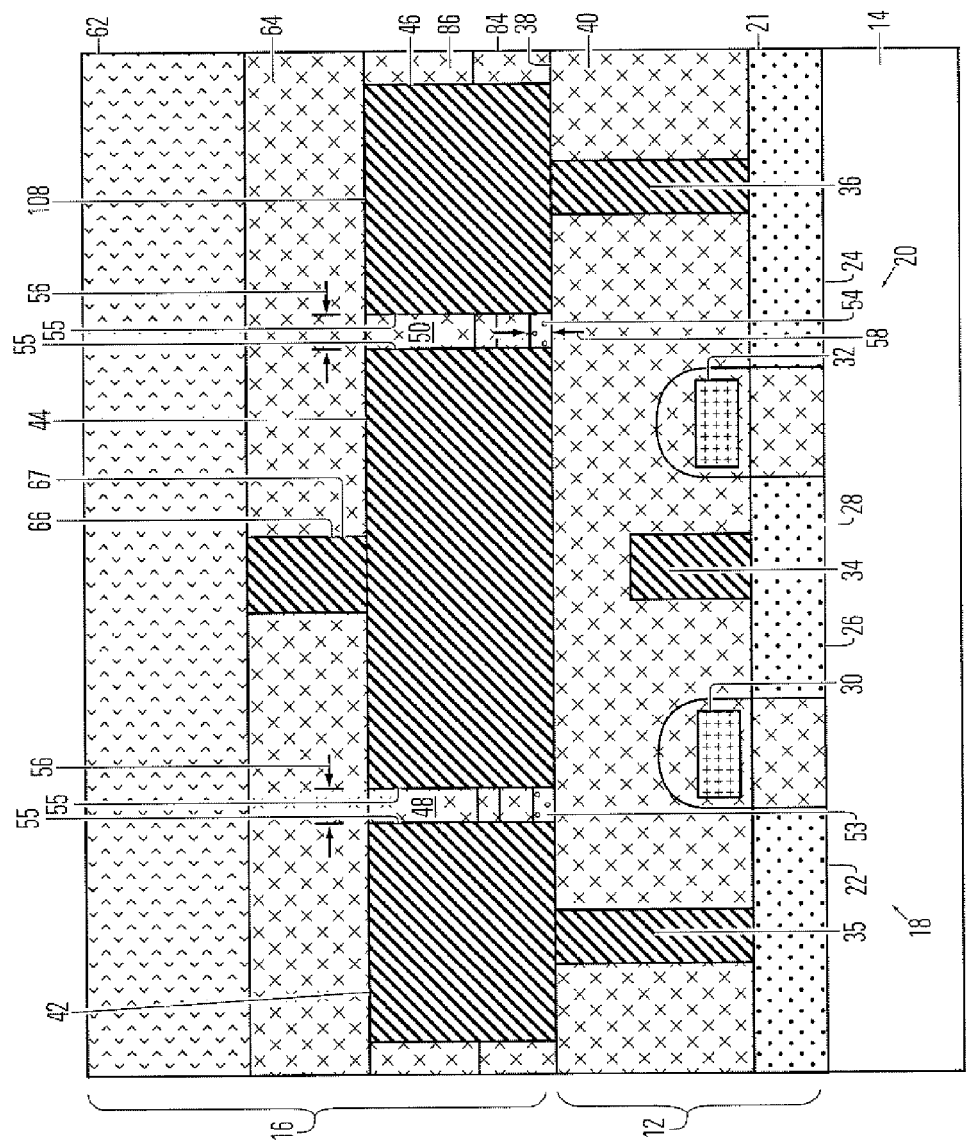

FIGS. 1 and 2 are two views of a phase change memory device 10 made according to one embodiment of the invention. Device 10 comprises broadly a memory cell access layer 12 formed on a substrate 14 and a memory cell layer 16 formed on top of access layer 12. In this embodiment, access layer 12 comprises first and second access transistors 18, 20 formed at doped layer 21. Access transistors 18, 20 comprise first and second drains 22, 24, first and second sources 26, 28, first and second polysilicon word lines acting as first and second gates 30, 32, and a common source line 34. Common source line 34 contacts first and second sources 26, 28. If desired, a separate source line for each of first and second sources 26, 28 could be provided. Access transistors 18, 20 are generally conventional but need not be so. Also, access layer 12 could include access devices other than access transistors. First and second plugs 35, 36 extend from the top surface 38 of memory cell access layer 12, through a dielectric film layer 40 and to doped layer 21.

Memory cell layer 16 comprises a first electrode 42 contacting top surface 38 and first plug 35, a second electrode 44 contacting top surface 38, and a third electrode 46 contacting top surface 38 and second plug 36. First and second electrodes 42, 44 are separated by a gap 48 while second and third electrodes 44, 46 are separated by a gap 50. First and second phase change bridges 52, 54 are formed within first and second gaps 48, 50 between and in contact with top surface 38 and in contact with the side walls 55 defining electrodes 42, 44, 46. As shown in FIG. 2, first and second phase change bridges 52, 54 have a width 56 and a thickness 58. As shown in FIG. 1, each of first and second phase change bridges 52, 54 have a length 60. Width 56, thickness 58 and length 60 are typically the same for both phase change bridges, but need not be so. As discussed in more detail below, the size of phase change bridges 52, 54 is minimized to reduce the current needed to cause a change between a lower resistivity, generally crystalline state and a higher resistivity, generally amorphous state.

Memory cell layer 16 also includes a conductive bit line 62 separated from electrode 42, 44 and 46 by a separation layer 64, typically made of a dielectric material such as silicon dioxide. An electrically conductive plug 67 extends through a via formed through second separation layer 64 to electrically connect bit line 62 and second electrode 44.

Figure 3:
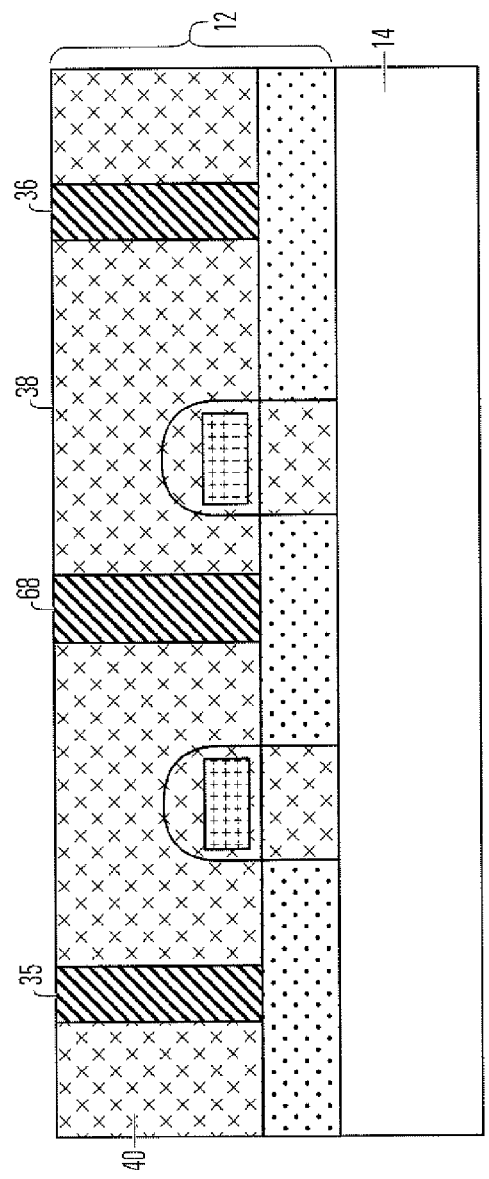
Figure 4:
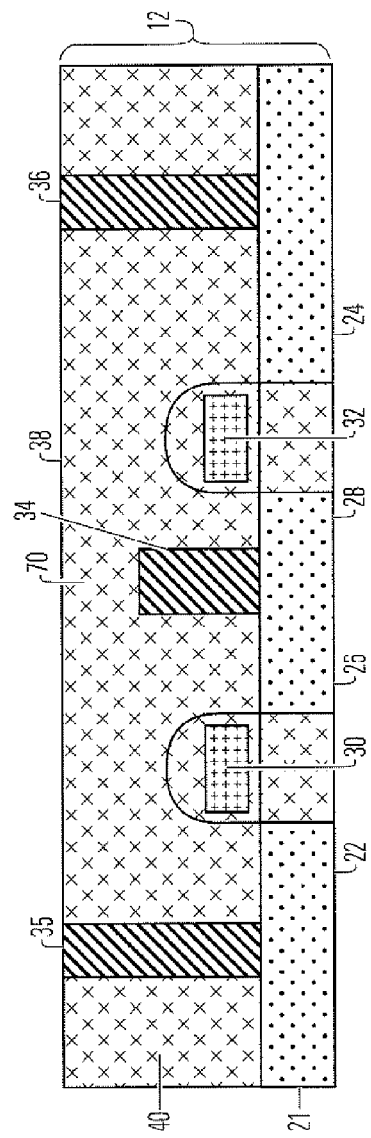

A method for making phase change memory devices will now be discussed with reference to FIGS. 3-20. Memory cell access layer 12 is typically made by conventional techniques. FIGS. 3 and 4 illustrate the final stages of making memory cell access layer 12. A source plug 68 is formed from top surface 38 to doped layer 21 between first and second gates 30, 32. A portion of source plug 68 adjacent to top surface 38 is removed, typically by etching, and the etched region is filled in with a dielectric material 70. Thereafter top surface 38 is subjected to chemical mechanical polishing to make the top surface suitable for deposition of memory cell layer 16.

Figure 5:
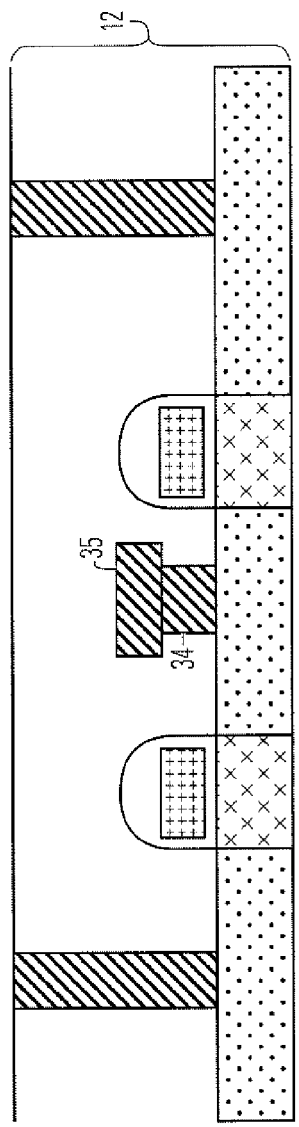
Figure 6:
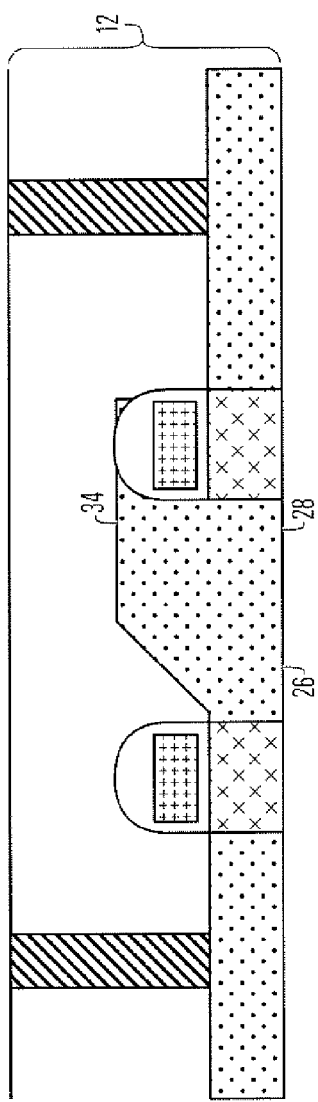

FIG. 5 illustrates an alternative embodiment of memory cell access layer 12 in which a common source line 34 is a local interconnect common source line comprising pads 35 used to permit lower electrical resistance access to the common source line by via plugs (not shown) formed in layer 40. FIG. 6 illustrates a further embodiment of memory cell access layer 12 in which the common source line 34 is created as a buried N+ diffusion source line.

Figure 7:
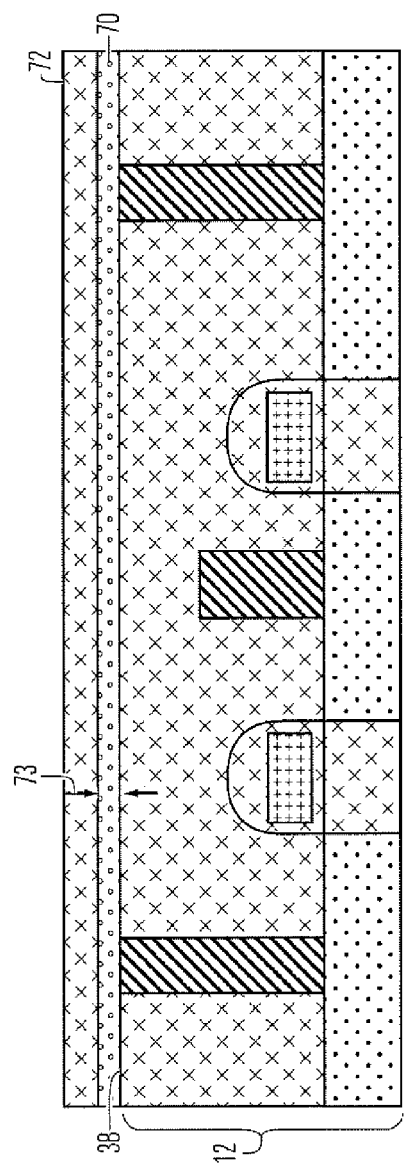

FIG. 7 shows the memory cell access layer 12 of FIG. 4 after deposition of a phase change material layer 70 on top surface 38 and deposition of a first barrier layer 72, also called a cap layer, layer 72 typically an SiN oxygen barrier layer. Phase change material layer 70 has a thickness 73 corresponding to thickness 58 of FIG. 2. Layer 70 is preferably as thin as it can be made while maintaining appropriate functional characteristics for phase change bridges 52, 54. In this embodiment both layers 70, 72 are about 20 nm thick. Thickness 73 is preferably about 10 to 50 nm and more preferably no more than about 20 nm thick when made of, for example, conventional phase change materials described below, well below the minimum photolithographic feature size used to create mask 74 (discussed below), typically about 200 nm.

Figures 8, 9:
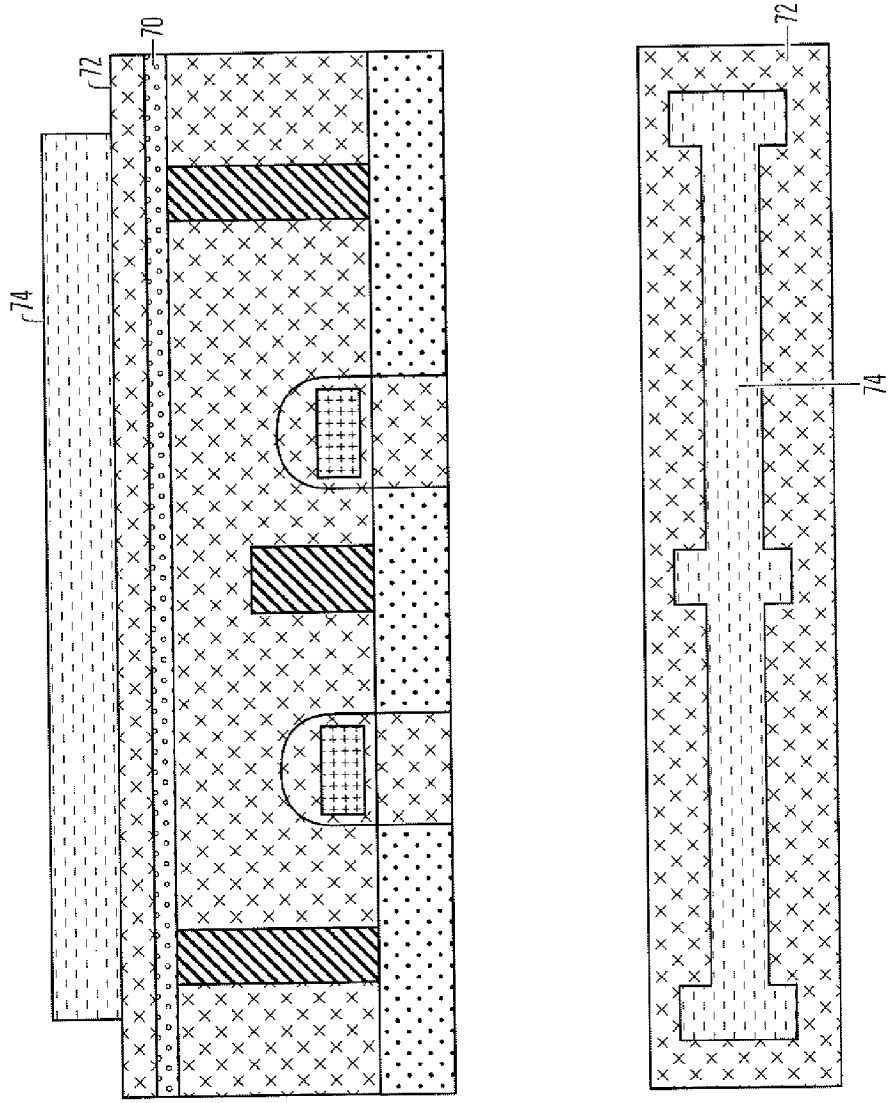
Figure 10:
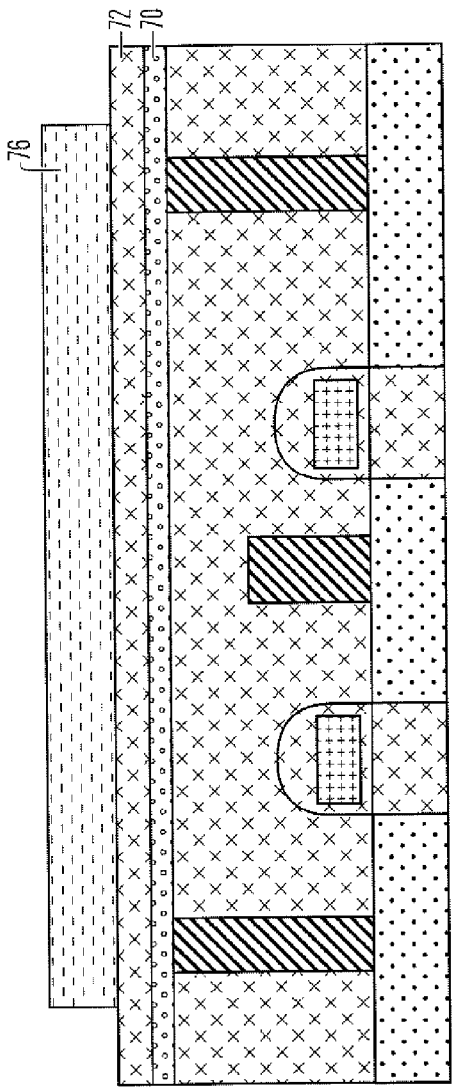
Figure 11:
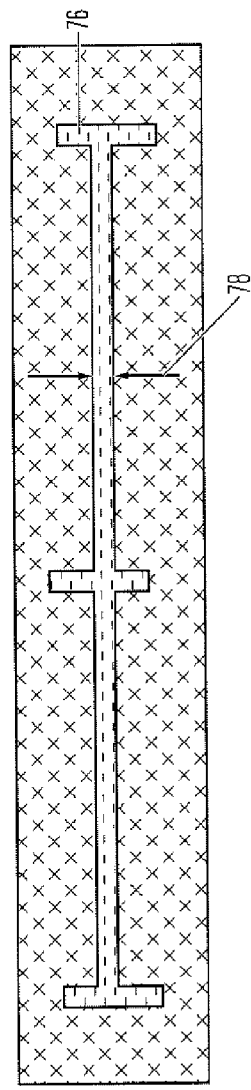
Figure 12:
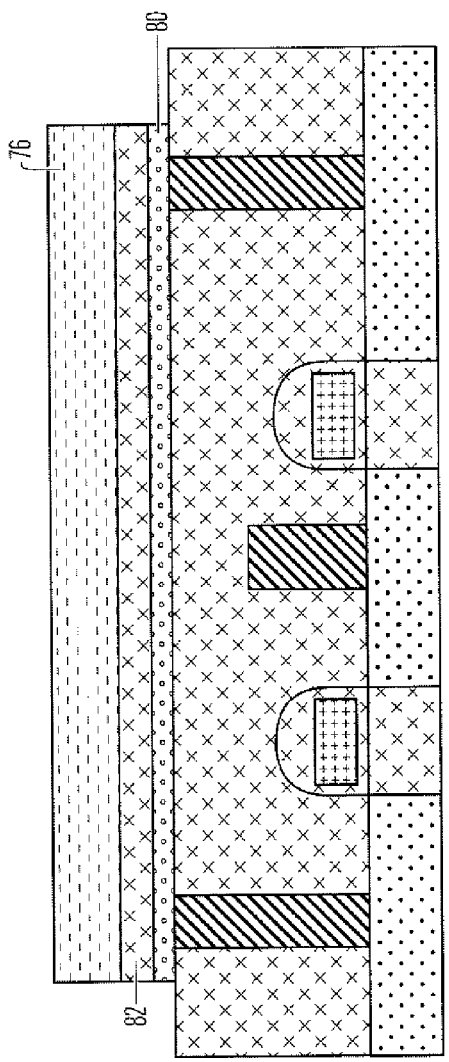
Figure 13:
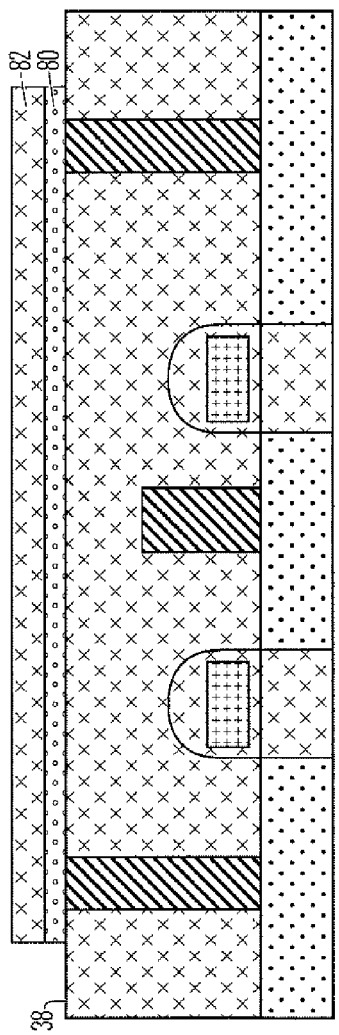

FIGS. 8 and 9 illustrate the result of forming a first photoresist mask 74 on first barrier layer 72. Mask 74 is typically made by photolithography and is the first mask that will be used in creating phase change bridges 52, 54. FIGS. 10 and 11 illustrate the result of a photoresist oxygen plasma trimming step to create a reduced size mask 76 having a first dimension 78, the first dimension corresponding to length 60 of FIG. 1. First dimension 78 is, in this embodiment, about 40 nm, well below the minimum photolithographic feature size used to create mask 74, typically about 200 nm. First dimension 78 is preferably about 10 to 50 nm and more preferably no more than about 40 nm thick. FIG. 12 illustrates the result of etching layers 72 and 70 except where covered by reduced size mask 76. This results in a first phase change bridge structure 80 and a first barrier layer structure 82 having the same shape as reduced size mask 76 illustrated in FIG. 11. FIG. 13 shows results of removing reduced size mask 76 to leave structures 80, 82.

Figures 14, 15:
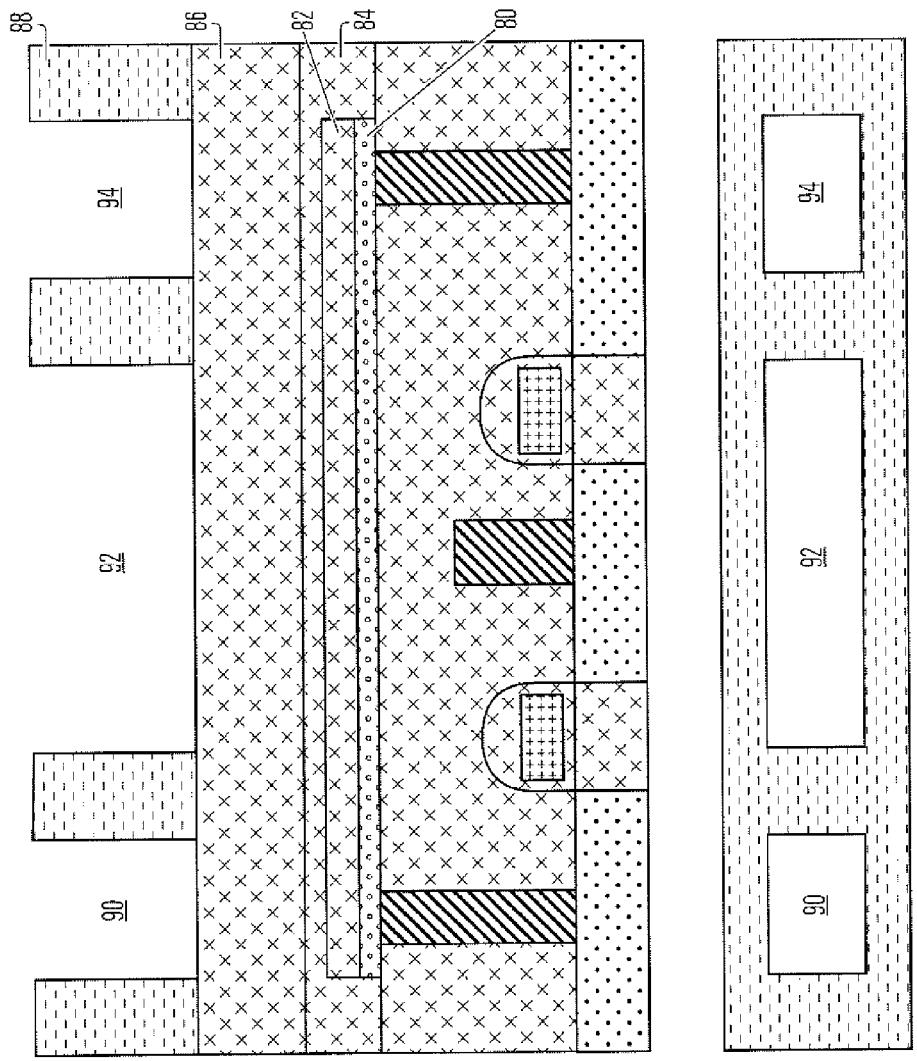

FIGS. 14 and 15 illustrate the result of several processing steps. A second barrier layer 84, typically made of SiN, is deposited on structures 82, 80 as well as exposed portions of top surface 38. A first separation layer 86, typically made of an oxide such as silicon oxide, is deposited on second barrier layer 84, layer 86 being about 300 nm thick in this embodiment. A second photoresist mask 88, typically made by photolithography, is formed on first separation layer 86. Mask 88 has first, second and third open regions 90, 92, 94 extending down to first separation layer 86. FIGS. 16 and 17 illustrate the results of a second photoresist oxygen plasma trimming step to create a second reduced size mask 96. Open regions 90, 92 and 94 defined by mask 96 are larger than their counterparts defined by mask 88. This step causes mask 96 to have a second dimension 98, corresponding to width 56 of FIG. 2, the second dimension being less than the minimum photolithographic feature size of this second photoresist oxygen plasma trimming step. In one preferred embodiment second dimension 98 is about 60 nm. Second dimension 98 is preferably about 10 to 100 nm and more preferably no more than about 60 nm thick.

Figure 18:
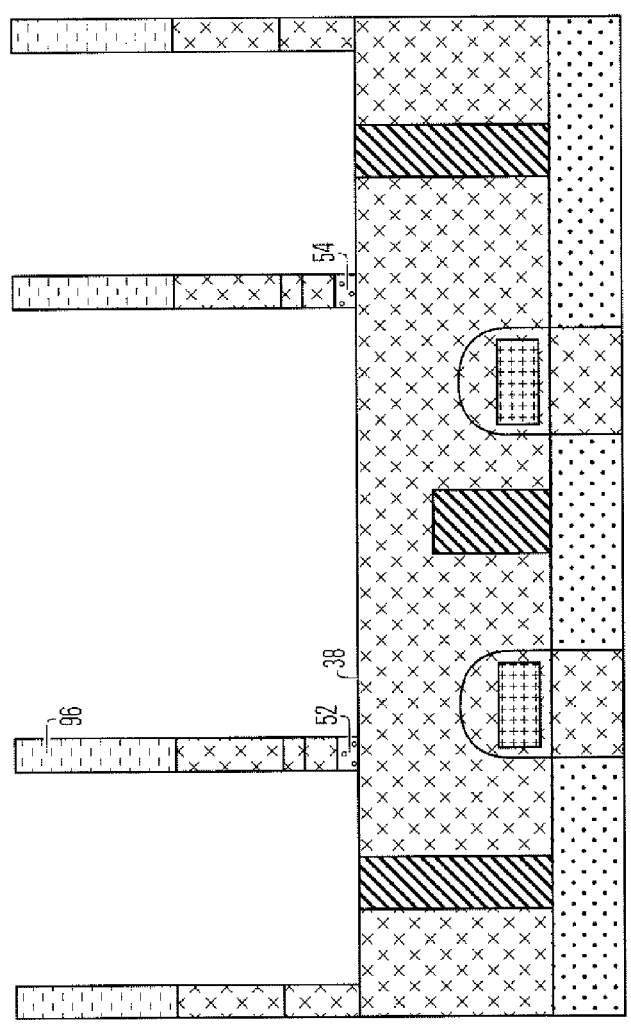

FIG. 18 shows results of an oxide RIE (reactive ion etch) etching step so that all material within open regions 90, 92 and 94 down to top surface 38 is removed. The etching recipe for etching the oxide first separation layer 86 is changed for etching the SiN barrier layers 82, 84 and phase change bridge structure 80. This etching step forms first and second phase change bridges 52, 54. First open region 90 contacts first phase change bridge 52, second open region 92 contacts first and second phase change bridges 52, 54 and third open region 94 contacts second phase change bridge 54.

Figure 19:
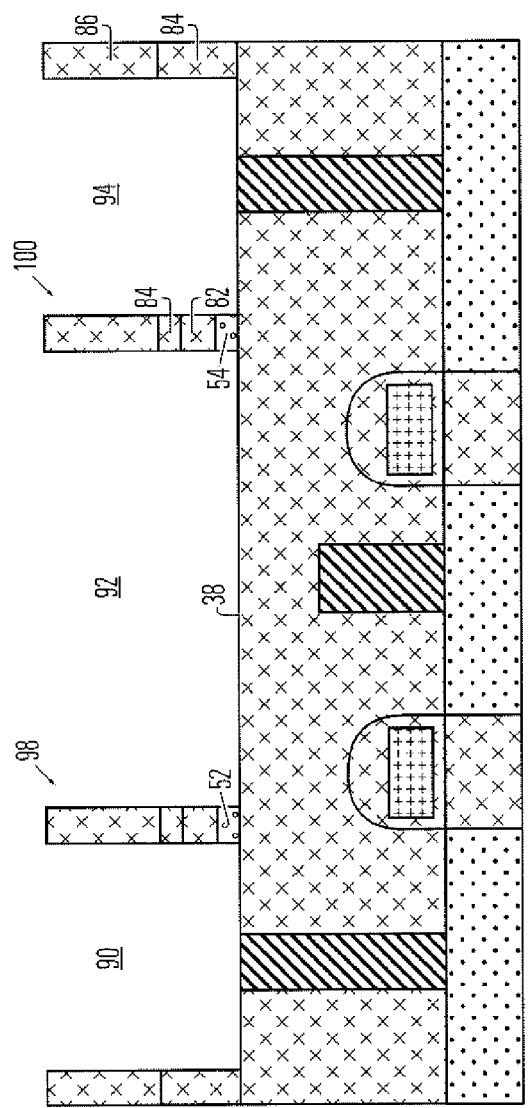
Figure 20:
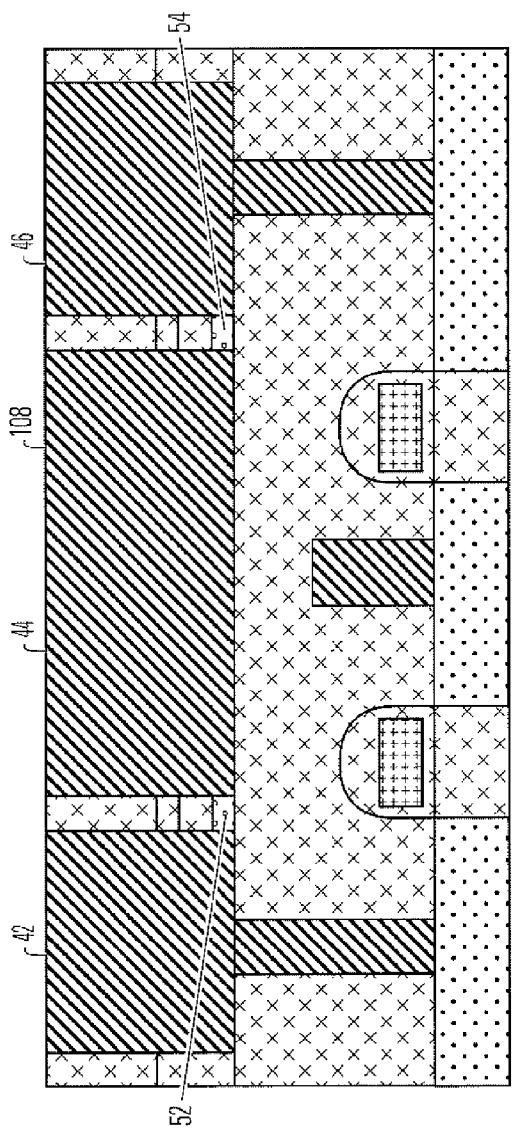

FIG. 19 illustrates results of removing second reduced size mask 96 leaving first and second stacks of material 98, 100. First, second and third open regions 90, 92 and 94, which are separated from one another, are least partially filled with a first electrically conductive material, to create first, second and third electrodes 42, 44 and 46 as shown in FIG. 20. This is followed by chemical mechanical polishing to create surface 102. Second separation layer 64 is applied to surface 102 and a via 66 is formed through layer 64 to contact second electrode 44. A second electrically conductive material is then applied onto layer 64 and into via 66 to create plug 67 within the via and bit line 62 over layer 64. The resulting phase change memory device 10 is illustrated in FIGS. 1 and 2.

Electrodes 42, 44, 46 in the illustrated embodiments are preferably TiN or TaN. Alternatively, these components may be TiAlN or TaAlN, or may comprise, for further examples, one or more elements selected from the group consisting essentially of Ti, W, Mo, Al, Ta, Cu, Pt, Ir, La, Ni, and Ru and alloys thereof. Plugs 35, 36, 67 are typically made of tungsten while common source line 34 and bit line 62 are typically created by copper metallization; other types of metallization, including aluminum, titanium nitride, and tungsten based materials, can be used as well.

Embodiments of the memory cell include phase change based memory materials, including chalcogenide based materials and other materials, for phase change bridges 52, 54. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$ (oboru Yamada, "Potential of Ge—Sb—Te Phase-Change Optical Disks for High-Data-Rate Recording", *SPIE* v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. A material useful for implementation of a PCRAM described herein is $Ge_2Sb_2Te_5$. Other types of phase change materials can also be used.

For additional information on the manufacture, component materials, use and operation of phase change random access memory devices, see U.S. patent application Ser. No. 11/155,067, filed 17 Jun. 2005, entitled Thin Film Fuse Phase Change Ram And Manufacturing Method.

Advantages of an embodiment described herein include that the current used in reset and programming is confined in a small volume allowing high current density and resultant local heating at lower reset current levels and lower reset power levels.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are hereby incorporated by reference.

What is claimed is:

1. A phase change memory device comprising:
a memory cell access layer; and
a memory cell layer, operably coupled to the memory cell access layer, comprising a photolithographically formed phase change memory cell, said memory cell comprising:
  first and second electrodes having first and second opposed, spaced apart sides, respectively;
  a phase change bridge positioned between the first and second sides and electrically coupling the first and second sides to one another;
  the phase change bridge having a length, a width and a thickness, the width measured between the first and second sides and the length measured perpendicular to the width; and
  the width, the thickness and the length being less than a minimum photolithographic feature size used to form the phase change memory cell.

2. The device of claim 1, wherein the phase change bridge has two solid phases that are reversibly inducible by a current.

3. The device of claim 1, wherein the phase change bridge has two solid phases that are reversibly inducible by a voltage applied across one or more of the electrodes.

4. The device of claim 1, wherein the phase change bridge has at least two solid phases that include a generally amorphous phase and a generally crystalline phase.

5. The device of claim 1, wherein the phase change bridge comprises memory material comprising an alloy including a combination of Ge, Sb, and Te.

6. The device of claim 1, wherein the phase change bridge comprises memory material comprising an alloy including a combination of two or more materials from the group of Ge, Sb, Te, Se, In, Ti, Ga, Bi, Sn, Cu, Pd, Pb, Ag, S, and Au.

7. The device of claim 1, wherein the first and second electrodes comprise an element selected from a group consisting of Ti, W, Mo, Al, Ta, Cu, Pt, Ir, La, Ni, and Ru and alloys thereof.

8. The device of claim 1, wherein the minimum photolithographic feature size is about 200 nm.

9. The device of claim 1, wherein the width is about 10 to 100 nm.

10. The device of claim 1, wherein the width is no more than about 60 nm.

11. The device of claim 1, wherein the length is about 10 to 50 nm.

12. The device of claim 1, wherein the length is no more than about 40 nm.

13. The device of claim 1, wherein the thickness is about 10 to 50 nm.

14. The device of claim 1, wherein the length is no more than about 20 nm thick.

15. A method for making a phase change memory device comprising:
forming a memory cell access layer on a substrate, the memory cell access layer comprising an access device and a top surface;
forming a memory cell layer, operably coupled to the memory cell access layer, comprising a photolithographically formed phase change memory cell, said memory cell comprising:
  first and second electrodes having first and second opposed, spaced apart sides, respectively;
  a phase change bridge positioned between the first and second sides and electrically coupling the first and second sides to one another; and
  the phase change bridge having a length, a width and a thickness, the width measured between the first and second sides and the length measured perpendicular to the width and parallel to the top surface; and
the memory layer forming step comprising reducing the size of photoresist masks used in said memory layer forming step so that the width and the length of the phase change bridge are each less than a minimum photolithographic feature size used to form the phase change memory cell.

16. The method according to claim 15 wherein the memory cell access layer forming step comprises forming an access device comprising: a source, a common source line associated with the source and spaced apart from the top surface, first and second drains, a first gate associated with the first drain and the source, a second gate associate with the second drain and the source, and first and second conductor plugs extending from the top surface to the first and second drains.

* * * * *